United States Patent
Shealy et al.

(10) Patent No.: US 8,791,034 B2
(45) Date of Patent: Jul. 29, 2014

(54) CHEMICAL VAPOR DEPOSITION PROCESS FOR ALUMINUM SILICON NITRIDE

(75) Inventors: James R. Shealy, Ithaca, NY (US); Richard Brown, Ithaca, NY (US)

(73) Assignee: Cornell University, Ithaca, NY (US)

( * ) Notice: Subject to any disclaimer, the term of this patent is extended or adjusted under 35 U.S.C. 154(b) by 33 days.

(21) Appl. No.: 13/380,144

(22) PCT Filed: Jun. 28, 2010

(86) PCT No.: PCT/US2010/040136
§ 371 (c)(1), (2), (4) Date: Mar. 5, 2012

(87) PCT Pub. No.: WO2010/151856
PCT Pub. Date: Dec. 29, 2010

(65) Prior Publication Data
US 2012/0156895 A1    Jun. 21, 2012

Related U.S. Application Data

(60) Provisional application No. 61/220,975, filed on Jun. 26, 2009.

(51) Int. Cl.
*H01L 21/318* (2006.01)
*H01L 21/443* (2006.01)

(52) U.S. Cl.
USPC .......................... 438/791; 438/680; 438/786

(58) Field of Classification Search
CPC ............... H01L 21/0217; H01L 21/02274; H01L 21/025; H01L 21/0262; H01L 21/3185; H01L 29/2003
See application file for complete search history.

(56) References Cited

U.S. PATENT DOCUMENTS

| | | | |
|---|---|---|---|
| 4,733,283 | A | 3/1988 | Kuroda |
| 4,792,474 | A | 12/1988 | Murakami et al. |
| 4,957,604 | A | 9/1990 | Steininger |
| 7,230,284 | B2 | 6/2007 | Parikh et al. |

(Continued)

FOREIGN PATENT DOCUMENTS

| | | |
|---|---|---|
| KR | 1020090030651 A | 3/2009 |
| WO | WO0113436 A1 | 2/2001 |

OTHER PUBLICATIONS

Brown R.J. et al. AlxSiyNz Passivated AlGaN/GaN High Electron Mobility Transistors In: Device Research Conference 2009, IEEE, Jun. 22-24, 2009, pp. 153-154.

(Continued)

*Primary Examiner* — Zandra Smith
*Assistant Examiner* — Pamela E Perkins
(74) *Attorney, Agent, or Firm* — William Greener; Alek P. Szecsy; Bond, Schoeneck & King, PLLC

(57) ABSTRACT

A chemical vapor deposition method for forming an aluminum-silicon nitride layer upon a substrate uses an aluminum precursor, a silicon precursor and a nitrogen precursor under chemical vapor deposition conditions to deposit the aluminum-silicon nitride layer upon the substrate. The aluminum-silicon nitride layer has an index of refraction interposed between silicon nitride and aluminum nitride. The aluminum-silicon nitride layer also has a bandgap from about 4.5 to about 6 eV and a permittivity from about $6\times10^{-11}$ to about $8\times10^{-11}$ F/m. The aluminum-silicon nitride layer may be further thermally annealed to reduce a hydrogen content of the aluminum-silicon nitride layer.

28 Claims, 6 Drawing Sheets

(56) References Cited

U.S. PATENT DOCUMENTS

| | | |
|---|---|---|
| 7,273,822 B2 | 9/2007 | Yeo et al. |
| 7,338,826 B2 | 3/2008 | Mittereder et al. |
| 7,371,649 B2 | 5/2008 | Cheng |
| 7,595,270 B2 | 9/2009 | Elers et al. |
| 7,632,726 B2 | 12/2009 | Heying et al. |
| 7,649,215 B2 | 1/2010 | Beach |
| 2002/0020341 A1* | 2/2002 | Marchand et al. ............... 117/84 |
| 2002/0125573 A1 | 9/2002 | Cuchiaro et al. |
| 2005/0158977 A1 | 7/2005 | Yeo et al. |
| 2005/0199945 A1* | 9/2005 | Kodama et al. ............... 257/324 |
| 2006/0006415 A1 | 1/2006 | Wu et al. |
| 2006/0014355 A1* | 1/2006 | Park et al. ..................... 438/382 |
| 2007/0059870 A1 | 3/2007 | Cheng |
| 2007/0158683 A1 | 7/2007 | Sheppard et al. |
| 2007/0252223 A1 | 11/2007 | Lee et al. |
| 2008/0176390 A1 | 7/2008 | Cheng |
| 2009/0004816 A1 | 1/2009 | Lee et al. |
| 2009/0146185 A1 | 6/2009 | Suh et al. |
| 2009/0148985 A1 | 6/2009 | Heying et al. |
| 2009/0263975 A1* | 10/2009 | Kadonaga et al. ............ 438/763 |
| 2010/0109098 A1 | 5/2010 | Lin et al. |

OTHER PUBLICATIONS

Taniyasu et al., Lattice parameters of wurtzite Al1-xSixN ternary alloys, Applied Physics Letters, vol. 79, No. 26, Dec. 24, 2001, American Institute of Physics, 4351-4353.

* cited by examiner

CHEMICAL VAPOR DEPOSITION PROCESS FOR ALUMINUM SILICON NITRIDE

CROSS-REFERENCE TO RELATED APPLICATIONS

The instant application is a US national stage filing from, and claims priority to, PCT Application Serial Number PCT/US2010/040136 filed Jun. 28, 2010, which claims priority from U.S. Provisional Application Ser. No. 61/220,975 filed 26 Jun. 2009, entitled Chemical Vapor Deposition Process for Aluminum Silicon Nitride, the contents of which are incorporated herein fully by reference. This application is also related to co-assigned PCT application Ser. No. 10/40,137 filed on an even date herewith, entitled Method for Forming III-V Semiconductor Structures Passivated with Aluminum-Silicon Nitride Layers. This application is also related to co-assigned PCT Application Serial Number US2010/040129 filed 10 Jun. 2010, entitled III-V Semiconductor Structures Passivated With Aluminum-Silicon Nitride Layers, the contents of which are incorporated herein fully by reference.

BACKGROUND

1. Field of the Invention

The invention relates generally to dielectric layers within microelectronic structures. More particularly, the invention relates to enhanced performance dielectric layers within microelectronic structures.

2. Description of the Related Art

Dielectric layers play a crucial role in the fabrication and operation of many semiconductor structures and semiconductor devices. Moreover, the choice of a particular dielectric material for a particular dielectric layer is often heavily dependent on a particular application intended to be addressed by the particular dielectric layer.

For example, for a fixed thickness of a particular dielectric layer, applications where it is advantageous to maximize capacitance between conducting structures are best satisfied by a dielectric layer comprising a high-k (low bandgap) dielectric material having a dielectric constant greater than about 5. However, use of such a low bandgap dielectric material increases the probability of leakage currents due to quantum mechanical tunneling processes through the low bandgap dielectric material that comprises the dielectric layer. Alternatively, applications where low capacitance between conducting structures is desirable, and where low leakage currents are also sought, are best satisfied by a dielectric layer comprising a low-k (large bandgap) dielectric material having a dielectric constant less than about 4.

Thus, many semiconductor structures and semiconductor devices have unique performance requirements and criteria that may be influenced by particular characteristics of dielectric layers. Therefore, desirable are alternative dielectric layers and dielectric materials that may be used in semiconductor structures and semiconductor devices, as well as methods that may be used to fabricate those alternative dielectric layers and dielectric materials that may be used in those semiconductor structures and semiconductor devices.

SUMMARY

The invention includes a chemical vapor deposition method that may be used for forming over a substrate an aluminum-silicon nitride layer that may be used within a microelectronic structure that includes the substrate. The aluminum-silicon nitride layer comprises an aluminum-silicon nitride material that has: (1) a bandgap from about 4.5 to about 6 eV; and (2) a permittivity from about $6\times10^{-11}$ to about $8\times10^{-11}$ F/m, at a microwave frequency from 1 to 100 GHz.

The aluminum-silicon nitride layer that comprises the aluminum-silicon nitride dielectric material with the foregoing bandgap and permittivity characteristics is desirable within microelectronic structure and microelectronic device fabrication since the foregoing bandgap and permittivity characteristics may be uniquely desirable for certain passivation applications in devices where surface charge is an issue. The chemical vapor deposition method for forming the aluminum-silicon nitride layer is desirable within microelectronic structure and microelectronic device fabrication insofar as such methodology allows for a chemical compositional variation and tuning when depositing the aluminum-silicon nitride dielectric material that comprises the aluminum-silicon nitride layer.

A particular method for forming an aluminum-silicon nitride layer in accordance with the invention includes introducing a silicon precursor, a nitrogen precursor and an aluminum precursor into a reactor chamber having a substrate positioned within the reactor chamber. This particular method also includes reacting the silicon precursor, the nitrogen precursor and the aluminum precursor under chemical vapor deposition conditions effective to deposit an aluminum-silicon nitride layer upon the substrate.

Another particular method for forming an aluminum-silicon nitride layer in accordance with the invention includes introducing a silicon precursor, a nitrogen precursor and an aluminum precursor into a reactor chamber having a substrate positioned within the reactor chamber. This particular method also includes reacting the silicon precursor, the nitrogen precursor and the aluminum precursor under chemical vapor deposition conditions that include: (1) a reactor chamber pressure from about 0.1 to about 760 torr; and (2) a substrate temperature from about 200 to about 1100 degrees centigrade, to deposit an aluminum-silicon nitride layer upon the substrate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENTS

The invention, which includes a chemical vapor deposition method for depositing over a substrate an aluminum-silicon nitride layer for use within a microelectronic structure, is understood within the context of the description set forth below. The description set forth below is further understood within the context of the drawings described above. Since the drawings described above are intended for illustrative purposes, the drawings are not necessarily drawn to scale.

The following description will sequentially describe a general deposition apparatus and general deposition conditions that may in general be used for depositing an aluminum-silicon nitride layer in accordance with a general embodiment of the invention. This general description will then be followed by a more specific description of the chemical and physical properties of particular exemplary aluminum-silicon nitride layers deposited in accordance with a more specific embodiment of the invention.

I. General Deposition Apparatus and General Deposition Conditions

Figure 1:
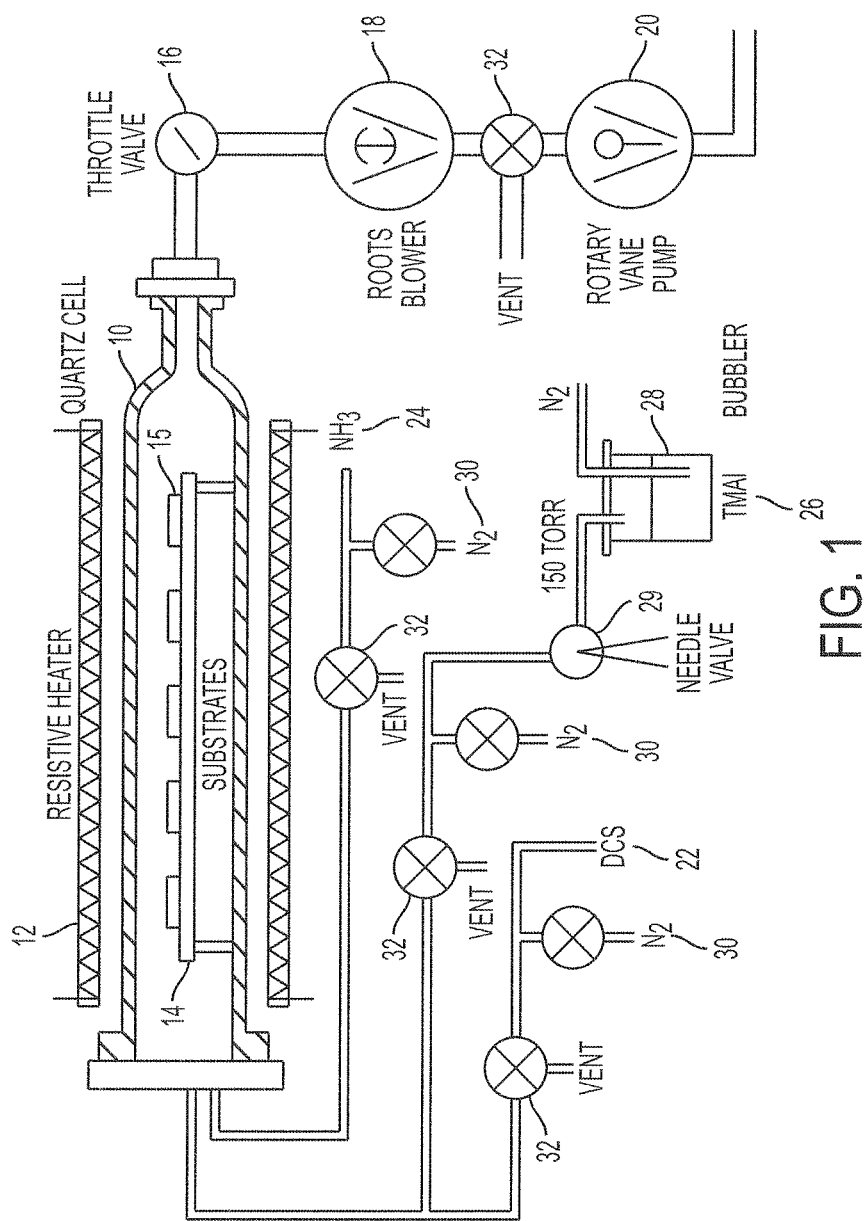
FIG. 1 shows a schematic diagram of a chemical vapor deposition apparatus for depositing an aluminum-silicon nitride layer upon a substrate in accordance with a general embodiment of the invention.

FIG. 1 shows a schematic diagram of a chemical vapor deposition apparatus that may in general be used to deposit an aluminum-silicon nitride layer upon a substrate in accordance with a general embodiment of the invention.

FIG. 1 shows a reactor chamber 10 in a specific but not limiting embodiment of a quartz cell. The reactor chamber 10 may also comprise any of several alternative constructions and configurations that are common in the chemical vapor deposition apparatus design, fabrication and operation art. Such alternative constructions and configurations may be fabricated using materials including but not limited to conductor materials and dielectric materials.

As is also illustrated in FIG. 1, the reactor chamber 10 is resistively heated by a resistive heater 12, although other heating means, such as but not limited to inductive heating means, are also not precluded or excluded within the general embodiment. In particular, the general embodiment also contemplates a rapid thermal annealing (RTA) heating means that provides a temperature rise to about 1100 degrees centigrade in a time period of about 3000 milliseconds. Alternative activation means (for activating reactants) that are not necessarily heating means are also not precluded or excluded within the general embodiment of the chemical vapor deposition apparatus of FIG. 1. Such alternative activation means may include, but are not limited to plasma activation means.

As is illustrated within FIG. 1, included within the reactor chamber 10 is a susceptor 14 upon which is located and positioned a plurality of substrates 15. The susceptor 14 is of an otherwise generally conventional construction within the context of chemical vapor deposition apparatus design, fabrication and operation. Particular features and considerations regarding the plurality of substrates 15, which are not specifically intended as part of the chemical vapor deposition apparatus that is illustrated in FIG. 1, are discussed in greater detail below.

As is illustrated in FIG. 1, the reactor chamber 10 may be evacuated by means of a roots blower 18 in tandem with a rotary vane pump 20, where an evacuation flow from the reactor chamber 10 is further modulated through action of a throttle valve 16 interposed between the reactor chamber 10 and the roots blower 18. The throttle valve 16, the roots blower 18 and the rotary vane pump 20 are sized appropriately to the reactor chamber 10, and are otherwise generally conventional within the chemical vapor deposition apparatus design, fabrication and operation art.

The chemical vapor deposition apparatus in accordance with FIG. 1 also includes: (1) a silicon precursor 22 (i.e., a silicon precursor source material specifically illustrated as dichlorosilane (DCS), but not intended to be so limited); (2) a nitrogen precursor 24 (i.e., a nitrogen precursor source material specifically illustrated as ammonia (NH3), but also not intended to be so limited); and (3) an aluminum precursor 26 (i.e., an aluminum precursor source material specifically illustrated as trimethylaluminum (TMA1) contained within a bubbler 28 whose flow is controlled by a needle valve 29, but also not intended to be so limited), for purposes of chemical vapor deposition of an aluminum-silicon nitride layer upon the plurality of substrates 15 in accordance with the general embodiment. Associated with each of the silicon precursor 22, the nitrogen precursor 24 and the aluminum precursor 26 is a carrier gas 30 (and related valve) that is specifically illustrated as nitrogen (N2), but is furthermore also not intended to be so limited.

The chemical vapor deposition apparatus in accordance with FIG. 1 also includes several generally conventional vent valves 32 located and assembled at strategic locations within the chemical vapor deposition apparatus.

The chemical vapor deposition apparatus in accordance with FIG. 1 is sized appropriately to accommodate the plurality of substrates 15, as is generally desirable within the context of the microelectronics fabrication art, including the semiconductor fabrication art. The chemical vapor deposition apparatus of FIG. 1 may comprise additional components that are otherwise also generally conventional in the chemical vapor deposition apparatus design, fabrication and operation art.

The chemical vapor deposition apparatus in accordance with FIG. 1 may be employed within the context of chemical vapor deposition methods including but not limited to: (1) atmospheric pressure chemical vapor deposition (APCVD) methods (i.e., from greater than about 650 to about 760 torr); (2) sub-atmospheric pressure chemical vapor deposition (SACVD) methods (i.e., from about 50 to about 650 torr); and (3) low pressure chemical vapor deposition (LPCVD) methods (i.e., from about 0.01 to less than about 50 torr).

The chemical vapor deposition apparatus of FIG. 1 may also be employed within the context of plasma enhanced chemical vapor deposition (PECVD) methods, including but not limited to high density plasma chemical vapor deposition (HDP-CVD) methods that include a substrate 15 bias of up to about 1500 watts. Within the general embodiment of the invention, the chemical vapor deposition apparatus as is illustrated in FIG. 1 is preferably used within the context of a low pressure chemical vapor deposition method.

Within a chemical vapor deposition method in accordance with the embodiments, the silicon precursor 22 may include, but is not necessarily limited to silane, monochlorosilane, dichlorosilane, trichlorosilane, silicon tetrachloride, disilane, trisilane, tris(dimethylamino)silane, tetrakis(dimethylamino)silane, tetrakis(ethylmethylamino)silane and tetraethylorthosilicate.

Similarly, the nitrogen precursor 24 may include, but is not necessarily limited to nitrogen, ammonia, hydrazine, tert-butylamine, 1,1-dimethylhydrazine and tert-butylhydrazine.

Finally, the aluminum precursor 26 may include, but is not necessarily limited to trimethylaluminum, triethylaluminum, trimethylamine alane, aluminum chloride, dimethylaluminium hydride and diethylaluminium ethoxide.

The carrier gas 30 may include, but is not necessarily limited to hydrogen, helium, nitrogen and argon.

General operating conditions for the chemical vapor deposition apparatus of FIG. 1 in accordance with the general embodiment include: (1) a reactor chamber 10 pressure from about 0.01 to about 760 torr, more preferably from about 0.1 to about 10 ton and most preferably from about 0.25 to about 5 torr; (2) a reactor chamber 10 and substrate 15 temperature from about 200 to about 1100 degrees centigrade, more preferably from about 400 to about 1000 degrees centigrade and most preferably from about 600 to about 800 degrees centigrade; (3) a silicon precursor 22 flow from about 2 to about 1000 standard cubic centimeters per minute in a carrier gas 30 flow from about 100 to about 20000 standard cubic centimeters per minute, more preferably from about 10 to about 500 standard cubic centimeters per minute in a carrier gas 30 flow from about 500 to about 10000 standard cubic centimeters per minute and most preferably from about 50 to about 250 standard cubic centimeters per minute in a carrier gas 30 flow from about 1000 to about 2000 standard cubic centimeters per minute; (4) a nitrogen precursor 24 flow from about 2 to about 5000 standard cubic centimeters per minute in a carrier gas 30 flow from about 100 to about 20000 standard cubic centimeters per minute, more preferably from about 10 to about 2500 standard cubic centimeters per minute in a carrier gas 30 flow from about 250 to about 10000 standard cubic centimeters per minute and most preferably from about 100 to about 1000 standard cubic centimeters per minute in a carrier gas 30 flow from about 1000 to about 5000 standard cubic centimeters per minute; and (5) an aluminum precursor 26 flow from about 1 to about 500 standard cubic centimeters per minute in a carrier gas 30 flow from about 10 to about 5000 standard cubic centimeters per minute, more preferably from about 5 to about 100 standard cubic centimeters per minute in a carrier gas 30 flow from about 50 to about 1000 standard cubic centimeters per minute and most preferably from about 5 to about 25 standard cubic centimeters per minute in a carrier gas 30 flow from about 500 to about 750 standard cubic centimeters per minute.

Typically and preferably, the foregoing conditions provide an aluminum-silicon nitride layer chemical vapor deposition rate from about 1 to about 1000 angstroms per minute, more preferably from about 5 to about 500 angstroms per minute and most preferably from about 10 to about 200 angstroms per minute.

Within the general embodiment of the invention, any one or more of the silicon precursor 22, the nitrogen precursor 24 and the aluminum precursor 26 may be introduced into the reactor chamber 10 at a uniform flow rate, or in the alternative any one or more of the foregoing precursors may be introduced into the reactor chamber 10 at a non-uniform flow rate. Similarly, any one or more of the silicon precursor 22, the nitrogen precursor 24 and the aluminum precursor 26 may be introduced into the reactor chamber 10 in a vent-in mode that provides for vent stabilization of flow of the particular precursor prior to deposition of an aluminum-silicon nitride layer in accordance with the general embodiment. Thus, the particular aluminum-silicon nitride layer that may be formed in accordance with such a vent-in mode may be formed with enhanced and more uniform materials properties.

Finally, within the general embodiment of the invention any two or all of the silicon precursor 22, the nitrogen precursor 24 and the aluminum precursor 26 may be introduced into the reactor chamber 10 simultaneously (i.e., silicon precursor 22 and nitrogen precursor 24; silicon precursor 22 and aluminum precursor 26; nitrogen precursor 24 and aluminum precursor 26; or silicon precursor 22, nitrogen precursor 24 and nitrogen precursor 26).

Figures 2A, 2B, 2C:
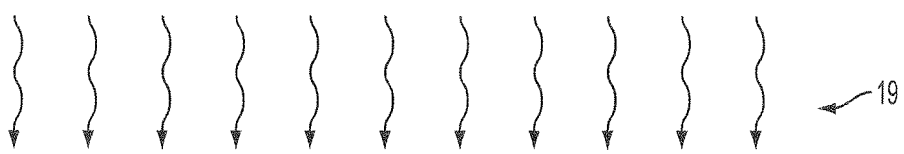
FIG. 2A, FIG. 2B and FIG. 2C show a series of schematic cross-sectional diagrams illustrating the results of progressive process stages in depositing and processing upon a substrate an aluminum-silicon nitride layer in accordance with the general embodiment of the invention.

FIG. 2A shows a substrate 15 in accordance with the schematic diagram of FIG. 1, upon which may be deposited an aluminum-silicon nitride layer in accordance with the instant general embodiment. More particularly, the substrate 15 may comprise any of several substrate materials from which microelectronics substrates may typically be comprised within the context of the microelectronics fabrication art. Such substrate materials may include, but are not necessarily limited to conductor materials, semiconductor materials and dielectric materials, as well as composites of conductor materials, semiconductor materials and dielectric materials.

With respect to semiconductor materials, the substrate 15 may comprise, but is not necessarily limited to silicon, germanium, silicon-germanium alloy, silicon-carbon alloy, silicon-germanium-carbon alloy and compound semiconductor materials such as but not limited to III-V and II-VI compound semiconductor materials. More specific examples of compound semiconductor materials may include, but are not necessarily limited to gallium arsenide, gallium nitride, gallium phosphide and indium phosphide compound semiconductor materials. Also considered within the context of the general embodiment is sapphire as a material from which the substrate 15 is at least in-part comprised.

This particular general embodiment also contemplates that the substrate 15 may comprise any one, or more, of a crystalline material, a polycrystalline material and an amorphous material. This particular general embodiment also contemplates that the substrate 15 may comprise a plurality of layers located upon or over a nominal "base" substrate. Such a plurality of layers may include, but is not necessarily limited to epitaxial layers, comprised of materials composition including but not limited conductor materials, semiconductor materials and dielectric materials, and combinations of conductor materials, semiconductor materials and dielectric materials. This particular general embodiment also contemplates that any of the "base" materials from which may be comprised the substrate 15, or any overlying layers, may comprise stoichiometric or non-stoichiometric compositions.

Finally, this particular general embodiment also contemplates that microelectronic devices may be located and formed within and upon the substrate 15 (i.e., including any particular overlying layers). Such microelectronic devices (which may include semiconductor devices), may further include, but are not necessarily limited to resistors, transistors, diodes and capacitors.

FIG. 2B shows the substrate 15 that is illustrated in FIG. 2A, but upon which is now located, formed and deposited an aluminum-silicon nitride layer 17 in accordance with the instant general embodiment, while using the particular deposition conditions and precursor material sources that are disclosed above.

Typically, the aluminum-silicon nitride layer 17 has a thickness from about 2 to about 5000 nanometers, more preferably from about 5 to about 1000 nanometers and most preferably from about 10 to about 100 nanometers. Typically, the aluminum-silicon nitride layer 17 has an aluminum content from about 0.1 to about 25 atomic percent, more preferably from about 1 to about 15 atomic percent and most preferably from about 5 to about 10 atomic percent. Typically, the aluminum-silicon nitride layer 17 has a silicon content from about 25 to about 55 atomic percent, more preferably from about 25 to about 45 atomic percent and most preferably from about 30 to about 40 atomic percent. Typically, the aluminum-silicon nitride layer 17 has a nitrogen content from about 40 to about 60 atomic percent, more preferably from about 45 to about 55 atomic percent and most preferably from about 50 to about 55 atomic percent.

The aluminum-silicon nitride layer 17 will also have a density from about 3.25 to about 3.45 grams per cubic centimeter, a relative dielectric constant from about 7 to about 9, a bandgap from about 4.5 to about 6 eV, a permittivity from about $6 \times 10^{-11}$ to about $8 \times 10^{-11}$ F/m and a hydrogen content from about 0.1 to about 5 atomic percent, more typically from about 3 to about 4 percent.

The bandgap of the aluminum-silicon nitride layer 17 is generally measured via optical absorption spectra that discern the wavelength value of strong optical absorption, corresponding to the bandgap.

The permittivity of the aluminum-silicon nitride layer 17 is generally inferred from the capacitance of the aluminum-silicon nitride layer 17 within a capacitor of a known capacitor geometry.

Values for the bandgap and the permittivity of the aluminum-silicon nitride layer 17 may also be interpolated from the corresponding properties (including published values) for silicon nitride and aluminum nitride.

FIG. 2C shows the substrate 15 that is illustrated in FIG. 2A and FIG. 2B, but wherein the aluminum-silicon nitride layer 17 is treated with a thermal treatment 19 to provide an annealed aluminum-silicon nitride layer 17' located upon the substrate 15. The thermal treatment 19 is typically intended as a thermal annealing treatment at a temperature from about 500 to about 1100 degrees centigrade for a time period from about 5 to about 600 seconds, in an inert atmosphere, such as but not limited to nitrogen. The foregoing thermal treatment 19 provides the annealed aluminum-silicon nitride layer 17' having a density from about 3.25 to about 3.45 grams per cubic centimeter, a relative dielectric constant from about 7 to about 9, a bandgap from about 4.5 to about 6 eV, a permittivity from about $6 \times 10^{-11}$ to about $8 \times 10^{-11}$ F/m and a hydrogen content from about 0.1 to about 5 atomic percent, more typically from about 2 to about 3 atomic percent.

It is anticipated that the aluminum-silicon nitride layer 17 or the annealed aluminum-silicon nitride layer 17' in accordance with the foregoing general embodiment may be used within the context of any of several applications within a microelectronic structure, such as a semiconductor structure. Appropriate applications may be selected within the context of physical and chemical properties exhibited by the aluminum-silicon nitride layer 17 or the annealed aluminum-silicon nitride layer 17' in accordance with the instant general embodiment. Most commonly anticipated are applications that may benefit from a generally higher and intermediate dielectric constant of the aluminum-silicon nitride layer 17 or the annealed aluminum-silicon nitride layer 17', or alternatively the bandgap and permittivity characteristics of those layers, in comparison with a silicon nitride layer.

II. Experimental

A. Deposition Conditions

A silicon nitride layer, three different aluminum-silicon nitride layers and an aluminum nitride layer were deposited upon each of five silicon semiconductor substrates by a low pressure chemical vapor deposition method in a custom designed chemical vapor deposition apparatus generally in accordance with FIG. 1. Each of the five silicon semiconductor substrates was first cleaned by immersion in a 49% hydrofluoric acid solution for a time period of about 60 seconds, followed by a deionized water rinse and drying.

The particular deposition conditions with respect to all of the five deposited layers included: (1) a reactor chamber 10 pressure of 2.003+/−0.003 ton; (2) a reactor chamber 10 and substrate 15 temperature of 755+/−3 degrees centigrade; (3) a dichlorosilane silicon precursor in a nitrogen carrier gas flow of 1600 standard cubic centimeters per minute; (4) an ammonia nitrogen precursor in a nitrogen carrier gas flow of 1600 standard cubic centimeters per minute; and (5) a trimethylaluminum aluminum precursor in a nitrogen carrier gas flow of 738 standard cubic centimeters per minute.

Particular flow rates for the dichlorosilane silicon precursor, the ammonia nitrogen precursor and the trimethylaluminum aluminum precursor are listed in Table I. Under all experimental conditions, the ammonia nitrogen precursor was intended as an excess with respect to other precursor reactants.

TABLE I

Aluminum-Silicon Nitride Sample ID and Precursor Flow Rates

| Sample ID | NH3 Flow | SiH2Cl2 Flow | TMAI Flow |
|---|---|---|---|
| F1 SixNy | 110 sccm | 104 sccm | 0 sccm |
| F2 AlxSiyNz | 733 sccm | 104 sccm | 39.4 sccm |
| F3 AlxSiyNz | 733 sccm | 104 sccm | 74.7 sccm |
| F4 AlxSiyNz | 733 sccm | 104 sccm | 157.4 sccm |
| F5 AlxNy | 1319 sccm | 0 sccm | 98.4 sccm |

The silicon nitride layer, the three aluminum-silicon nitride layers and the aluminum nitride layer located, formed and deposited upon the five silicon semiconductor substrates were then examined more fully within the context of the following chemical and physical testing.

B. Refractive Index by Variable Angle Spectroscopic Ellipsometry (VASE)

For the F1 silicon nitride, F2 to F4 aluminum-silicon nitride and F5 aluminum nitride deposited layers as described above and listed in Table I, deposition rates were determined with the knowledge of the deposition time and measured thickness, as measured using Variable Angle Spectroscopic Ellipsometry (VASE). The VASE technique and instrument was necessary for the determination of a deposited layer thickness as the exact optical properties of the deposited layer (i.e., index of refraction and extinction coefficient) at different wavelengths was unknown.

To determine the optical constants of the F1 to F5 deposited layers the substrates were placed in an otherwise conventional VASE instrument which measures the complex ratio of reflection of light polarized parallel (p) and perpendicular (s) to the plane of incidence of the deposited layer/substrate which originates from a linearly polarized source. Since the F1 to F5 deposited layers of interest were deposited upon silicon substrates, the data obtained from the VASE instrument was fitted to a parametric model that took into account the silicon substrates. Moreover, the use of multiple measurement angles within the measurement methodology served to add redundancy to the measurements that allowed for subtraction of noise in the measurements.

Figure 3:
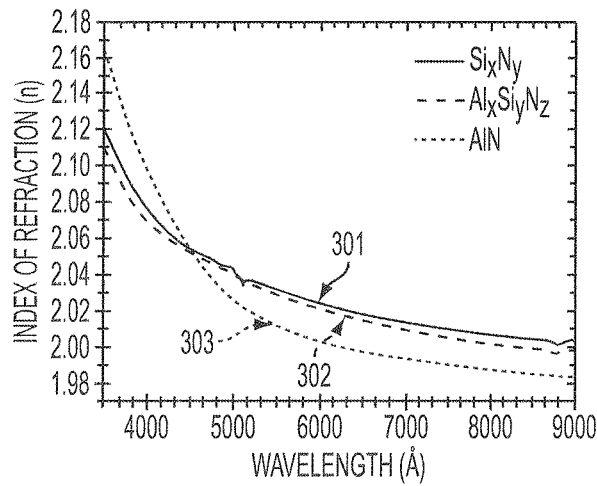
FIG. 3 shows a graph of Index of Refraction versus Wavelength for an aluminum-silicon nitride layer deposited in accordance with a more specific embodiment of the invention, in comparison with a silicon nitride layer and an aluminum nitride layer.

The index of refraction data is shown in FIG. 3, where reference numeral 301 corresponds with the F1 silicon nitride layer data, reference numeral 302 corresponds with the F2 aluminum-silicon nitride layer data and reference numeral 303 corresponds with the F5 aluminum nitride layer data. The index of refraction data that is shown in FIG. 3 illustrates that an index of refraction for an aluminum-silicon nitride layer is, as expected, between an index of refraction of a silicon nitride layer and an index of refraction of an aluminum nitride layer.

On the basis of the foregoing index of refraction data, it is anticipated that the F2 to F4 aluminum-silicon nitride deposited layers will have a bandgap from about 4.75 to about 5.25 eV.

C. Film Growth Rates

The growth rates of the five F1 to F5 layers deposited under the conditions described above and tabulated in Table I, are further tabulated in Table II. As can be seen from Table II, the deposition rate for layers deposited with both the dichlorosilane silicon precursor and the trimethylaluminum aluminum precursor increases with the trimethylaluminum aluminum precursor vapor mole fraction. This suggests that there may be a catalyzing reaction between the trimethylaluminum aluminum precursor and the dichlorosilane silicon precursor. It can be seen in sample F4 however, that this reaction saturates and the deposition rate enhancement in connection with the trimethylaluminum aluminum precursor vapor mole fraction levels off around a trimethylaluminum aluminum precursor vapor mole fraction of 0.12.

TABLE II

Aluminum Precursor Vapor Mole Fraction and Growth Rate

| Sample ID | Al Vapor Mole Fraction | Growth Rate |
|---|---|---|
| F1 SixNy | 0 | 19.5/min |
| F2 AlxSiyNz | 0.057 | 115.9/min |
| F3 AlxSiyNz | 0.106 | 188.6/min |
| F4 AlxSiyNz | 0.211 | 205.6/min |
| F5 AlxNy | 1 | 23.4/min |

Figure 4:
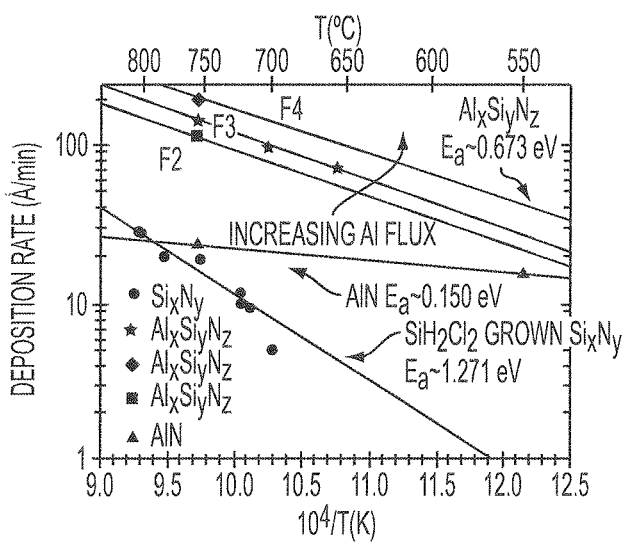
FIG. 4 shows a graph of Deposition Rate versus Inverse Temperature for an aluminum-silicon nitride layer deposited in accordance with a more specific embodiment of the invention, in comparison with a silicon nitride layer and an aluminum nitride layer.

An Arrhenius plot shown in FIG. 4 illustrates dependence of the deposition rate versus inverse temperature for the films grown in this study compared to films grown using silane as a silicon precursor. It is apparent from the plot that the growth rate of deposited layers using TMA1 is much less temperature dependant than the deposited layers only utilizing a silicon precursor. The activation energies of the reactions precipitating silicon nitride, aluminum nitride and the alloys of thereof are shown in FIG. 4. The reaction precipitating the F5 aluminum nitride had the lowest activation energy at −0.150 eV, while the reaction giving rise to the F1 silicon nitride had the highest activation energy which was measured to be −1.271 eV. The F2, F3 and F4 alloyed deposited layers had an activation energy that was intermediate between F1 and F5, coming in at around −0.673 eV. The activation energies for F2 and F4 were assumed to be the same as that calculated for F3, as indicated on the plot as having the same extrapolated slope as F3. The activation energy for silane grown silicon nitride has been measured to be around −1.1 eV, with a higher growth rate than dichlorosilane grown silicon nitride.

Figure 5:
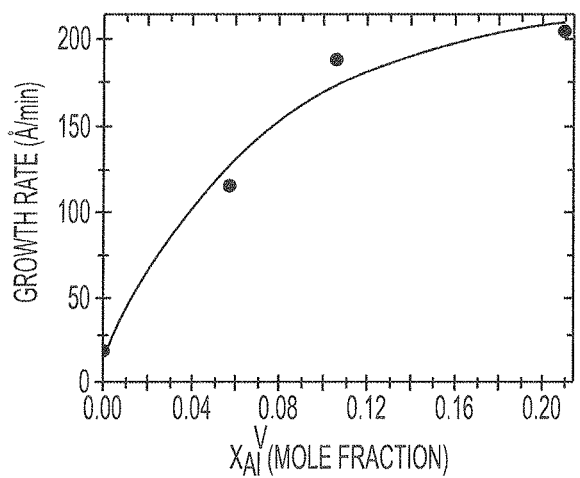
FIG. 5 shows a graph of Growth Rate versus Aluminum Precursor Mole Fraction for depositing an aluminum-silicon nitride layer in accordance with the more specific embodiment of the invention.

This particular saturation feature as described above with respect to trimethylaluminum aluminum vapor mole fraction is also more clearly illustrated in the graph of FIG. 5 which plots the data of Table II.

D. Deposited Layer Crystallinity by High Resolution X-Ray Diffraction (HRXRD)

A High Resolution X-Ray Diffraction (HRXRD) spectrum of the F5 aluminum nitride layer was obtained using a high resolution X-Ray diffractometer that is otherwise generally conventional.

The HRXRD spectrum is intended to determine and illustrate a level of crystallinity of a particular sample under high resolution X-Ray crystallographic investigation.

Figure 6:
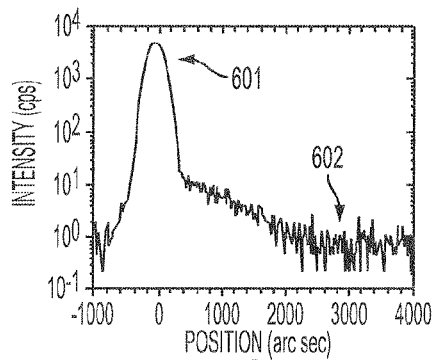
FIG. 6 shows a High Resolution X-Ray Diffraction (HRXRD) spectrum of Intensity versus Position for an aluminum nitride layer in accordance with the more specific embodiment of the invention.

The HRXRD spectrum is shown in FIG. 6, where the peak 601 which is centered at the 0 position derives from the crystalline silicon semiconductor substrate, and the peaks 602 centered in the 2000 to 4000 range derive from the deposited F5 aluminum nitride layer. Since the peaks 602 that derive from the deposited F5 aluminum nitride layer are dispersed and not as well defined as the silicon substrate peak 601, it is inferred from the HRXRD spectrum of FIG. 6 that the F5 aluminum nitride layer, and other related F2 to F4 aluminum-silicon nitride layers are amorphous as deposited.

E. Deposited Layer Composition by Rutherford Backscattering (RBS)

Rutherford Backscattering (RBS) spectroscopic analysis of deposited layers F1 to F5 was undertaken using a Rutherford Backscattering apparatus that is otherwise generally conventional. Particular measurement parameters included a 2 MeV source of helium ions and an accumulated charge per sample of 40 uC at a scattering angle of 15.6 degrees.

RBS analysis generally allows the determination of the types of atomic species present in a film and their relative concentrations to each other by measuring the energy loss spectrum of the backscattered helium ions that are incident on the sample. RBS has the advantage of being blind to the how the particular atoms in the sample are bonded to one another, as the backscattering of the ions is off of the atomic nuclei of the species of interest. However, RBS has the disadvantage that it is relatively insensitive to atoms with light nuclei, as the backscattered helium ions loose little energy to those species. Hence, the RBS technique cannot be used to detect lighter nuclei, especially hydrogen. The relative peaks in the energy loss spectrum obtained can be fit to theory to obtain the relative atomic concentrations of the species present in the deposited layers.

Figure 7:
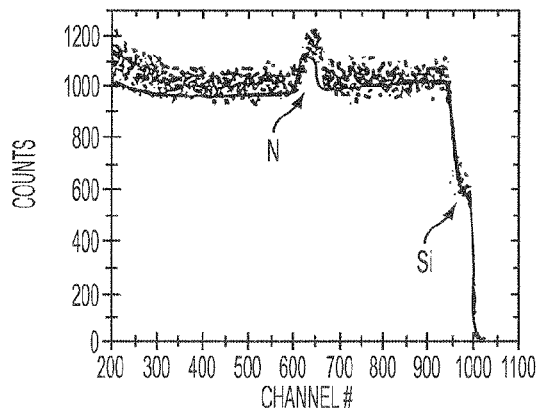
FIG. 7 to FIG. 9 show a series of Rutherford Backscattering (RBS) spectra of Counts versus Channel for an aluminum-silicon nitride layer in accordance with the more specific embodiment of the invention, in comparison with a silicon nitride layer and an aluminum nitride layer.
Figure 8:
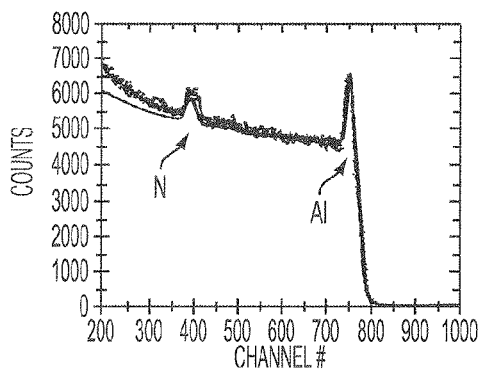
Figure 9:
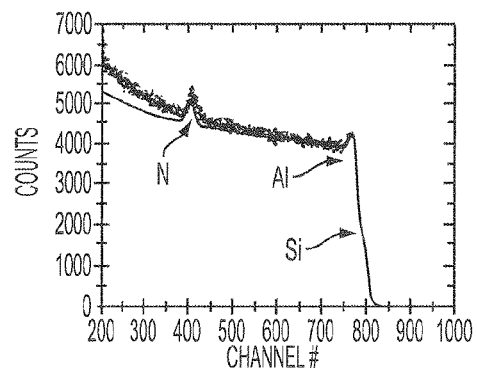

For the F1 silicon nitride layer, as can be seen in FIG. 7, only silicon S and nitrogen N peaks (along with the silicon substrate background) can be seen in the RBS spectra. This indicates that no other heavy (i.e., heavier than hydrogen) impurities are present in the deposited F1 silicon nitride layer to a degree comparable with the species desired in the deposited F1 silicon nitride. For the F4 aluminum-silicon nitride layer, it can be seen in FIG. 9 that an aluminum Al peak is present in addition to the silicon S and nitrogen N peaks that are present in FIG. 7. This indicates that there is successful aluminum incorporation into the F4 aluminum-silicon nitride layer. Finally, as illustrated in FIG. 8, only aluminum Al and nitrogen N peaks are seen for the deposited F5 aluminum nitride layer, as expected.

A hydrogen content of the deposited layers F1 to F5 can be determined with the same apparatus that is used for the RBS analysis, but with a different configuration. By directing the helium ions at an F1 to F5 deposited layer sample at a grazing angle, hydrogen atoms are ejected from the deposited layer in the forward direction toward the detector, thus allowing the measurement of F1 to F5 deposited layer hydrogen content to some degree. This forward scattering analysis was performed on the F2 aluminum-silicon nitride layer to determine the hydrogen content, which was found to be about 3.5%. Since all the F1 to F5 deposited layers were deposited in much the same manner, it was assumed that all the deposited layers F1 to F5 had a similar hydrogen content.

The results of fitting the theoretical to the collected RBS data for the F1 to F5 deposited layers are shown in Table III. The percentages do not add up to 100% due to hydrogen not being included in the theoretical fit (i.e., the amount needed to make the species percent add to 100% is attributed to hydrogen). For the deposited layers F1 to F5 in Table III, the simulated results suggest a hydrogen content of about 3-4%, which agrees well with the RBS forward scattering analysis.

TABLE III

Deposited Layer Composition by RBS

| Sample ID | Al Content | Si Content | N Content |
|---|---|---|---|
| F1 SixNy | | 46% | 49% |
| F2 AlxSiyNz | 8% | 36% | 51% |
| F3 AlxSiyNz | 11% | 32% | 53% |
| F4 AlxSiyNz | 12% | 31% | 53% |
| F5 AlxNy | 48% | | 47% |

F. Deposited Layer Composition by X-Ray Photoelectron Spectroscopy (XPS)

Another useful technique for determining the concentration of atomic species in a sample is X-Ray Photoelectron Spectroscopy (XPS). XPS also has the added utility of determining to some degree how the species in the sample are bonded.

Figure 10:
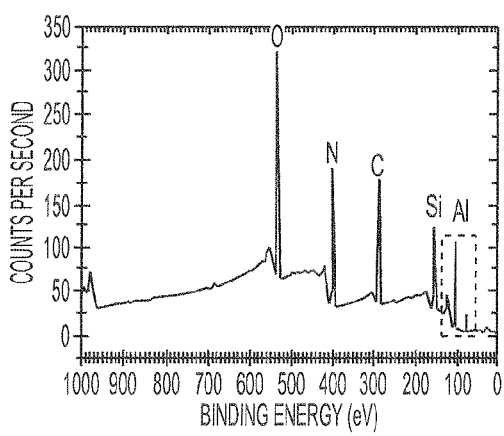
FIG. 10 shows an X-ray Photoelectron Spectroscopy (XPS) spectrum of Counts per Second versus Binding Energy for an aluminum-silicon nitride layer in accordance with the more specific embodiment of the invention.

In XPS, a sample is placed in an ultrahigh vacuum (UHV) chamber where monochromatic x-rays strike the surface of the sample at an angle. These x-rays eject photoelectrons from the atoms that make up the sample layer and an electron energy detector collects these ejected electrons. Every different species of atom has its own characteristic spectrum of electrons it ejects, hence it is possible to determine the relative concentrations of atoms in the film by looking at the relative intensities of the different spectral peaks that correspond to the different atoms. However, only electrons originating from atoms close to the surface actually escape into the vacuum chamber as ones originating from deeper in the sample are re-absorbed or trapped by the layers of atoms above them. Hence XPS is only sensitive to the first few nanometers of the sample. This requires a very clean sample as any surface contamination will be detected by the measurements. This is evidenced in FIG. 10, where along with the labeled aluminum Al, nitrogen N and silicon Si peaks of an F3 deposited layer, carbon and oxygen contaminant perks are also present.

Atomic concentrations of the species of interest within the F1 to F5 deposited layers are compiled in Table IV for XPS analysis. Like RBS, XPS analysis is also not sensitive to hydrogen. Thus, an accurate measurement of the hydrogen content of the F1 to F5 deposited layers remains only from the forward scattering experiment described above.

TABLE IV

Deposited Layer Composition by XPS

| Sample ID | Al Content | Si Content | N Content |
|---|---|---|---|
| F1 SixNy | | 60.2% | 39.8% |
| F2 AlxSiyNz | 5.6% | 50.8% | 43.5% |
| F3 AlxSiyNz | 8.8% | 47.8% | 43.4% |
| F4 AlxSiyNz | 11.5% | 46.4% | 42.1% |
| F5 AlxNy | 60.2% | | 39.8% |

Figure 11:
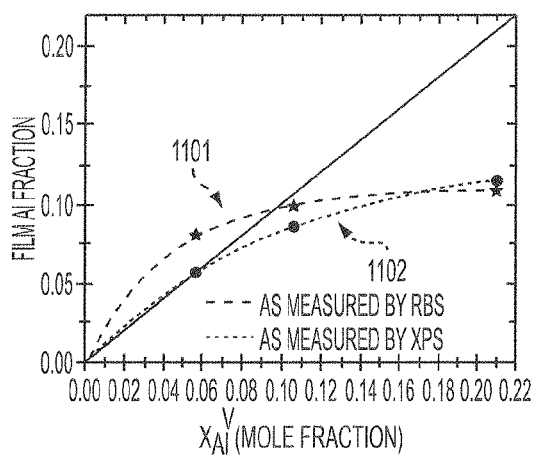
FIG. 11 shows a graph of Film Aluminum Fraction versus Aluminum Precursor Mole Fraction for an aluminum-silicon nitride layer in accordance with the more specific embodiment of the invention.

For comparison purposes, FIG. 11 shows a graph of deposited layer aluminum fraction versus aluminum precursor vapor mole fraction intended to correlate the elemental composition analysis determined for the F1 to F5 deposited layers via RBS and XPS. As is illustrated in FIG. 11, the correlation between the two measurements (i.e., reference numeral 1101 for RBS data and reference numeral 1102 for XPS data) is relatively close, absent substantial deviation between correlating data points.

G. Hydrogen Determination by Fourier Transform Infrared (FTIR) Spectroscopy

Due to the observation that both XPS and RBS are blind to hydrogen the F1 and F2 to F4 deposited layers were analyzed using Fourier transform infrared (FTIR) spectroscopy since the phonon modes of the atomic species in those deposited layers bonded to hydrogen have eigenenergies in the mid-IR region. The F1 and F2 to F4 deposited layers were analyzed using a conventional Fourier transform infrared instrument and methodology. The F1 and F2 to F4 deposited layers were deposited on double-side polished silicon substrates and measured in reflection mode with an angle of incidence of 70° and backed by a gold minor to increase the signal level (since silicon is largely transparent to mid-IR radiation). Signature absorption peaks for phonon modes in the films are displayed in FIG. 12 (for the F3 deposited aluminum-silicon nitride layer) and FIG. 13 (for the F1 deposited silicon nitride layer).

Hydrogen is an undesirable impurity in the deposited layers as it decreases the deposited layer density and increases the deposited layer wet-etch rate. Hence an attempt was made to remove any hydrogen from the F1 and F3 deposited layers by annealing the substrate at a temperature higher than the growth temperature to allow the hydrogen to diffuse out. Hydrogen was able to be reintroduced into the deposited layers by annealing in the forming gas up to a temperature of 850° C. Anneals at temperatures greater than 850° C., even in forming gas, resulted in the removal of hydrogen from the film. A nitrogen purged rapid thermal anneal (RTA) apparatus was used for this purpose.

Figure 12:
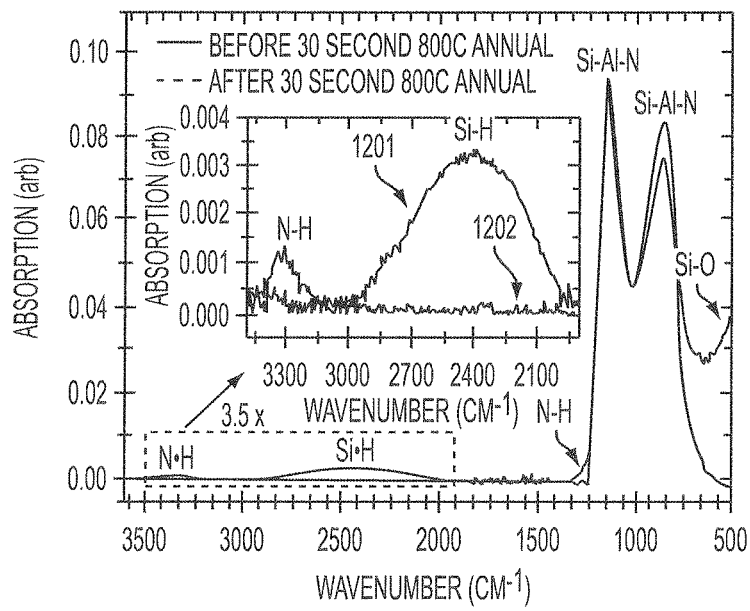
FIG. 12 and FIG. 13 shows a pair of Fourier Transform Infrared (FTIR) spectra of Absorption versus Wavenumber for an aluminum-silicon nitride layer in accordance with the more specific embodiment of the invention annealed at 800 degrees centigrade, in comparison with a silicon nitride layer annealed at 1000 degrees centigrade.
Figure 13:
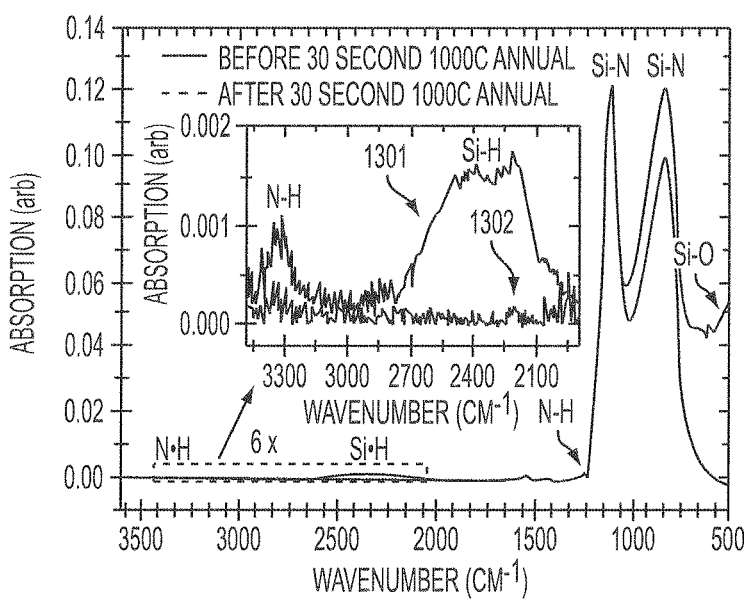

As is seen in FIG. 12 and FIG. 13, annealing at high temperature in nitrogen gas reduces the N—H and Si—H peaks in the FTIR spectra significantly (see spectrum 1202 in comparison with spectrum 1201 or spectrum 1302 in comparison with spectrum 1301). However it is noticed that the N—H peak is more difficult to eliminate than the Si—H peak. It is also evident that to remove the N—H and Si—H peaks from the F1 silicon nitride deposited layer spectra requires a considerably higher temperature of 1000° C. than the F3 aluminum-silicon-nitride deposited layer spectra, which occurred around 800° C.

H. Deposited Layer Densification with Anneal

Figure 14:
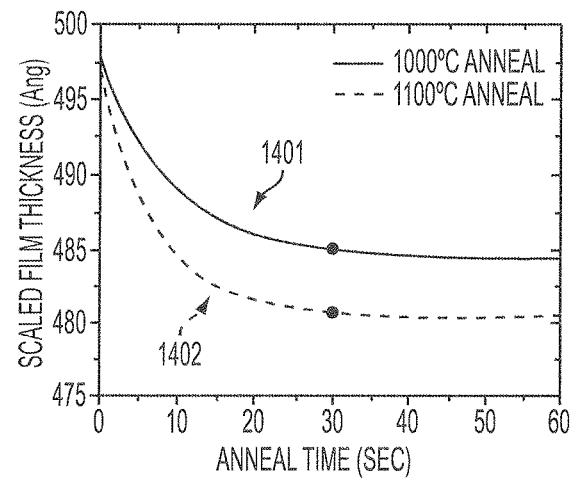
FIG. 14 shows a graph of Scaled Film Thickness versus Anneal Time for thermal annealing of an aluminum-silicon nitride layer in accordance with the more specific embodiment of the invention at multiple temperatures.
Figure 15:
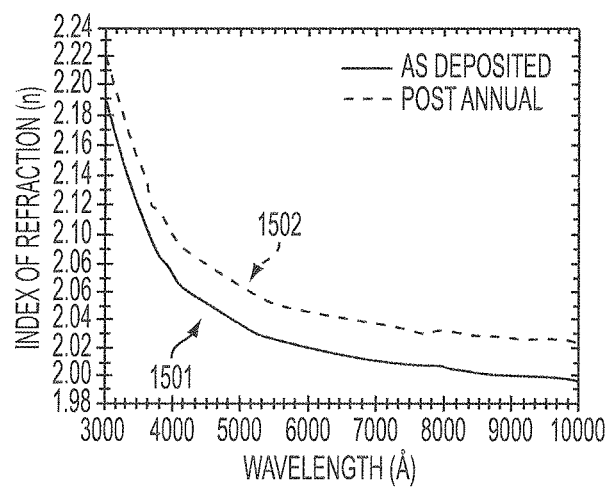
FIG. 15 shows a graph of Index of Refraction versus Wavelength for an aluminum-silicon nitride layer as deposited and post anneal in accordance with the more specific embodiment of the invention.

Two samples of F3 aluminum-silicon nitride were also analyzed via spectroscopic ellipsometry to determine if a reduction in hydrogen content from a nitrogen RTA anneal resulted in any measurable change in deposited layer thickness. Plotted in FIG. 14 are the results of this annealing experiment. It can be seen that relatively short anneals at high temperature 1000° C. (reference numeral 1401) and 1100° C. (reference numeral 1402) reduced the thickness of the film by 2.7% and 3.5% respectively after only 30 seconds of exposure. It can also be seen that further annealing at these temperatures does not further reduce the thickness of the F3 deposited layers The foregoing thermal anneal conditions also changed the index of refraction of the deposited layers. As can be seen in FIG. 15, annealing a deposited layer at 1000 and 1100° C. increases the F3 deposited layer index of refraction by about 1.25% (see reference numeral 1501 as deposited in comparison with reference numeral 1502 post anneal).

I. Deposited Layer Wet Etch Rates

The deposited layer etch rates were determined in 49% aqueous hydrofluoric (HF) acid and AZ4OOK developer (which comprises an alkaline composition). The F1 to F4 deposited layers all exhibited an etch rate of about 9.5+/−1 um/min when etched in 49% HF, and a negligibly small etch rate when etched in the AZ40OK developer. The F5 deposited layer exhibited a negligibly small etch rate in 49% HF, but a favorable etch rate of 15 nm/min in the AZ400K developer.

The preferred embodiments including the exemplary experimental embodiment data in accordance with the invention are illustrative of the invention rather than limiting of the invention. Revisions and modifications to methods, materials, structures and dimensions for an aluminum-silicon nitride layer formed in accordance with the preferred embodiments while still providing an embodiment in accordance with the invention, further in accordance with the accompanying claims.

What is claimed is:

1. A method for forming an aluminum-silicon nitride layer comprising:
   introducing a silicon precursor, a nitrogen precursor and an aluminum precursor into a reactor chamber having a substrate positioned within the reactor chamber; and
   reacting the silicon precursor, the nitrogen precursor and the aluminum precursor under chemical vapor deposition conditions effective to deposit an aluminum-silicon nitride layer upon the substrate, wherein the aluminum-silicon nitride layer has:
   a bandgap from about 4.5 to about 6 eV; and
   a permittivity from about $6\times10^{-11}$ to about $8\times10^{-11}$ F/m, at a frequency from 1 to 100 GHz.

2. The method of claim 1 wherein the chemical vapor deposition conditions are selected from the group consisting of atmospheric pressure chemical vapor deposition conditions, sub atmospheric pressure chemical vapor deposition conditions, low pressure chemical vapor deposition conditions and plasma enhanced chemical vapor deposition conditions.

3. The method of claim 1 wherein the substrate comprises a material selected from the group consisting of conductor materials, semiconductor materials, dielectric materials and composites of conductor materials, semiconductor materials and dielectric materials.

4. The method of claim 1 wherein the substrate comprises a material selected from the group consisting of silicon, germanium, silicon-germanium alloy, silicon-carbon alloy, silicon-germanium-carbon alloy, gallium arsenide, gallium nitride, gallium phosphide, indium phosphide, other III-V semiconductor, II-VI semiconductor and sapphire materials.

5. The method of claim 1 wherein the silicon precursor is selected from the group consisting of silane, monochlorosilane, dichlorosilane, trichlorosilane, silicon tetrachloride, disilane, trisilane, tris(dimethylamino)silane, tetrakis(dimethylamino)silane, tetrakis(ethylmethylamino)silane and tetraethylorthosilicate.

6. The method of claim 1 wherein the nitrogen precursor is selected from the group consisting of nitrogen, ammonia, hydrazine, tert-butylamine, 1,1-dimethylhydrazine and tert-butylhydrazine.

7. The method of claim 1 wherein the aluminum precursor is selected from the group consisting of trimethylaluminum, triethylaluminum, trimethylamine alane and aluminum chloride.

8. The method of claim 1 further comprising using a carrier gas to introduce the silicon precursor, the nitrogen precursor and the aluminum precursor into the reactor.

9. The method of claim 8 wherein the carrier gas is selected from the group consisting of nitrogen, argon, helium and hydrogen.

10. The method of claim 1 wherein the silicon precursor is introduced into the chamber at a flow rate of from about 2 and about 1000 standard cubic centimeters per minute.

11. The method of claim 1 wherein the nitrogen precursor is introduced into the chamber at a flow rate from about 2 to about 5000 standard cubic centimeters per minute.

12. The method of claim 1 wherein the aluminum precursor is introduced into the chamber at a flow rate from about 1 to about 100 standard cubic centimeters per minute.

13. The method of claim 1 wherein the aluminum precursor is combined with the silicon precursor prior to introducing into the reactor.

14. The method of claim 1 wherein the aluminum precursor is combined with the nitrogen precursor prior to introducing into the reactor.

15. The method of claim 1 wherein the silicon precursor, the nitrogen precursor and the aluminum precursor gas are introduced into the reactor at constant flow rates.

16. The method of claim 1 wherein the silicon precursor, the nitrogen precursor and the aluminum precursor gas are introduced into the reactor at variable flow rates.

17. The method of claim 1 wherein the silicon precursor and nitrogen precursor are introduced into the reactor at a constant flow rate and the aluminum precursor is introduced into the chamber at a variable flow rate.

18. The method of claim 1 wherein the reactor is maintained at a pressure from about 100 mtorr to about 760 torr and at a temperature from about 200° C. to about 1100° C.

19. The method of claim 1 wherein the reactor includes rapid thermal anneal capabilities.

20. The method of claim 1 wherein the reactor is maintained at a pressure from about 2.000 to 2.006 torr and at a temperature from about 752 to about 758° C.

21. The method of claim 1 wherein the aluminum-silicon nitride layer is deposited on the substrate at a growth rate from about 1 and about 500 angstroms per minute.

22. A method for forming an aluminum-silicon nitride layer comprising:
   introducing a silicon precursor, a nitrogen precursor and an aluminum precursor into a reactor chamber having a substrate positioned within the reactor chamber; and reacting the silicon precursor, the nitrogen precursor and the aluminum precursor under chemical vapor deposition conditions effective to deposit an aluminum-silicon nitride layer upon the substrate, wherein at least one of the silicon precursor, the nitrogen precursor and the aluminum precursor is stabilized by flowing to a vent line prior to introducing into the reactor.

23. A method for forming an aluminum-silicon nitride layer comprising:
introducing a silicon precursor, a nitrogen precursor and an aluminum precursor into a reactor chamber having a substrate positioned within the reactor chamber; and
reacting the silicon precursor, the nitrogen precursor and the aluminum precursor under chemical vapor deposition conditions effective to deposit an aluminum-silicon nitride layer upon the substrate, wherein the aluminum-silicon nitride layer has a hydrogen content from about 3 to about 4 atomic percent.

24. The method of claim 23 further comprising annealing the aluminum-silicon nitride layer in an inert atmosphere as a temperature from 600 to 1100 degrees centigrade.

25. A method for forming an aluminum-silicon nitride layer comprising:
introducing a silicon precursor, a nitrogen precursor and an aluminum precursor into a reactor chamber having a substrate positioned within the reactor chamber;
reacting the silicon precursor, the nitrogen precursor and the aluminum precursor under low pressure chemical vapor deposition conditions that include:
a reactor chamber pressure from about 0.01 to about 760 torr; and
a substrate temperature from about 200 to about 1100 degrees centigrade, to deposit an aluminum-silicon nitride layer having a hydrogen content from about 3 to about 4 atomic percent upon the substrate; and
annealing the aluminum-silicon nitride layer in an inert atmosphere at a temperature from about 600 to about 1100 degree centigrade for a time period from about 5 to about 600 seconds to form an annealed aluminum-silicon nitride layer that has a hydrogen content from about 2 to about 4 atomic percent upon the substrate.

26. A method for forming an aluminum-silicon nitride layer comprising:
introducing a silicon precursor, a nitrogen precursor and an aluminum precursor into a reactor chamber having a substrate positioned within the reactor chamber; and
reacting the silicon precursor, the nitrogen precursor and the aluminum precursor under low pressure chemical vapor deposition conditions that include:
a reactor chamber pressure from about 0.01 to about 760 torr; and
a substrate temperature from about 200 to about 1100 degrees centigrade, to deposit an aluminum-silicon nitride layer upon the substrate, wherein the aluminum-silicon nitride layer has:
a bandgap from about 4.5 to about 6; and
a permittivity from about $6\times10^{-11}$ to about $8\times10^{-11}$ F/m.

27. A method for forming an aluminum-silicon nitride layer comprising:
introducing a silicon precursor, a nitrogen precursor and an aluminum precursor into a reactor chamber having a substrate positioned within the reactor chamber; and
reacting the silicon precursor, the nitrogen precursor and the aluminum precursor under low pressure chemical vapor deposition conditions that include:
a reactor chamber pressure from about 0.01 to about 760 torr; and
a substrate temperature from about 200 to about 1100 degrees centigrade, to deposit an aluminum-silicon nitride layer upon the substrate, wherein the aluminum-silicon nitride layer has a hydrogen content from about 3 to about 4 atomic percent.

28. A method for forming an aluminum-silicon nitride layer comprising:
introducing a silicon precursor, a nitrogen precursor and an aluminum precursor into a reactor chamber having a substrate positioned within the reactor chamber;
reacting the silicon precursor, the nitrogen precursor and the aluminum precursor under low pressure chemical vapor deposition conditions that include:
a reactor chamber pressure from about 0.01 to about 760 torr; and
a substrate temperature from about 200 to about 1100 degrees centigrade, to deposit an aluminum-silicon nitride layer upon the substrate; and annealing the aluminum-silicon nitride layer in an inert atmosphere at a temperature from about 600 to about 1100 degree centigrade for a time period from about 5 to about 600 seconds to form an annealed aluminum-silicon nitride layer that has a hydrogen content from about 2 to about 4 atomic percent.

* * * * *

UNITED STATES PATENT AND TRADEMARK OFFICE
CERTIFICATE OF CORRECTION

PATENT NO. : 8,791,034 B2
APPLICATION NO. : 13/380144
DATED : July 29, 2014
INVENTOR(S) : James R. Shealy et al.

It is certified that error appears in the above-identified patent and that said Letters Patent is hereby corrected as shown below:

IN THE SPECIFICATION

Column 1, after the "Cross-Reference to Related Applications Paragraph", between lines 22 and 23, please insert the following:

--U.S. GOVERNMENT SPONSORSHIP

The invention was made with government support under Grant No. N00014-03-1-0963 from the Office of Naval Research. The Government has certain rights in the invention.--

Signed and Sealed this
Twelfth Day of May, 2015

Michelle K. Lee
*Director of the United States Patent and Trademark Office*